(12) United States Patent
Pradeep et al.

(10) Patent No.: US 6,228,770 B1
(45) Date of Patent: May 8, 2001

(54) METHOD TO FORM SELF-SEALING AIR GAPS BETWEEN METAL INTERCONNECTS

(75) Inventors: Yelehanka Ramachandramurthy Pradeep, Singapore (SG); Vijai Kumar Chhagan, Belgrave (GB); Henry Gerung; Madhusudan Mukhopadhyay, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/531,784

(22) Filed: Mar. 21, 2000

(51) Int. Cl.$^7$ .................................................. H01L 21/00
(52) U.S. Cl. .............................. 438/692; 216/38; 216/88; 438/745; 438/756; 438/757
(58) Field of Search .................................... 438/691, 692, 438/693, 745, 756, 757; 216/38, 88, 89; 156/345 LP

(56) References Cited

U.S. PATENT DOCUMENTS

| | | |
|---|---|---|
| 5,413,962 | 5/1995 | Lur et al. ............................. 437/195 |
| 5,461,003 | 10/1995 | Havemann et al. .................. 437/187 |
| 5,792,706 | 8/1998 | Michael et al. ...................... 438/626 |
| 5,814,555 | 9/1998 | Bandyopadhyay et al. ......... 438/619 |

*Primary Examiner*—William Powell
(74) *Attorney, Agent, or Firm*—George O. Saile; Rosemary L. S. Pike

(57) ABSTRACT

A new method of forming metal interconnects with air gaps between adjacent interconnects in the manufacture of an integrated circuit device is achieved. A semiconductor substrate is provided. The metal interconnects are formed overlying the semiconductor substrate. A silicon nitride liner layer is deposited. A gap filling oxide layer is deposited to fill gaps between adjacent metal interconnects. The gap filling oxide layer is polished down to the silicon nitride liner layer. A silicon nitride thin layer is deposited. The silicon nitride thin layer is patterned using an oversized, reverse mask of the metal interconnects. The patterning of the silicon nitride thin layer creates openings to thereby expose a portion of the gap filling oxide. The gap filling oxide layer is etched away. A self-sealing oxide layer is deposited overlying the silicon nitride thin layer and the silicon nitride liner layer. The self-sealing oxide layer seals over the gaps between the silicon nitride thin layer and the silicon nitride liner layer to thereby form permanent air gaps between the adjacent metal interconnects, and the integrated circuit is completed.

20 Claims, 7 Drawing Sheets

METHOD TO FORM SELF-SEALING AIR GAPS BETWEEN METAL INTERCONNECTS

BACKGROUND OF THE INVENTION (1) Field of the Invention

The invention relates to a method of fabricating semiconductor structures, and more particularly, to a method of forming self-sealing air gaps between metal interconnects in the manufacture of integrated circuit devices.

(2) Description of the Prior Art

Advances in integrated circuit manufacture have enabled the formation of very narrowly spaced metal interconnections. Such metal interconnect processes allow greater device density in the completed circuit. Unfortunately, as the line to line spacing in the interconnect layers is made smaller, the capacitive coupling between the lines becomes greater. Increased capacitive coupling causes cross-talk, where voltage fluctuations on one line induce voltage fluctuations on an adjacent line. Capacitive coupling also causes a reduction in switching speeds as the total capacitive line load increases. Both of these problems can adversely affect performance and yield.

Capacitive coupling increases inversely as the distance between the metal lines decreases. To counter this phenomenon, there are only two alternatives. First, the metal lines may be made thinner to reduce the effective coupling area between the lines. Unfortunately, this increases the resistance of the metal traces and reduces switching speed. The preferred method to reduce coupling is to reduce the dielectric constant ($\kappa$) of the material between the metal lines.

In recent years, many low dielectric materials have been proposed in the art for use as interlevel dielectrics. From a dielectric constant perspective, one of the best materials is air. Air has a dielectric constant of slightly greater than 1.0. By comparison, silicon dioxide has a dielectric constant of about 4.0. The capacitive coupling between adjacent metal lines can therefore be significantly reduced by replacing the typical silicon dioxide-based interlevel dielectric with air.

Several prior art approaches disclose methods to form air gaps between metal interconnections in the manufacture of an integrated circuit device. U.S. Pat. No. 5,461,003 to Havemann et al discloses a process to form low dielectric constant air gaps between adjacent metal lines on an integrated circuit device. A disposable solid material, such as photoresist, is deposited overlying the metal lines and filling the gaps between these metal lines. The disposable solid material is etched down to below the top surfaces of the metal lines. A porous dielectric layer is deposited overlying the metal lines and the disposable solid material. The disposable solid material is etched away by an etching process that can penetrate the porous dielectric layer. Etching processes, such as oxygen plasma and liquid acetone, are disclosed. Once the disposable solid material is removed, low dielectric constant air gaps are left between adjacent metal lines. Alternative embodiments include a passivation layer overlying the metal lines and an oxide layer overlying only the tops of the metal lines. U.S. Pat. No. 5,792,706 to Michael et al teaches a process to form low dielectric constant air gaps between and above metal lines. After metal line formation, a dielectric layer is deposited overlying and filling gaps between the metal lines. Deep, narrow trenches are etched through the dielectric layer. A capping layer of silicon dioxide is deposited overlying the dielectric layer. The capping layer cannot fill the deep, narrow trenches and merely seals the trenches to thereby form permanent air voids. U.S. Pat. No. 5,814,555 to Bandyopadhyay et al discloses a process to form voids in the dielectric layer between adjacent metal lines. The chemical vapor deposition (CVD) process conditions used in the deposition of the dielectric layer are conducive to forming voids.

SUMMARY OF THE INVENTION

A principal object of the present invention is to provide an effective and very manufacturable method of forming metal interconnects in the manufacture of integrated circuits.

A further object of the present invention is to provide a method to form metal interconnects with reduced interlevel dielectric capacitance.

A still further object of the present invention is to reduce interlevel dielectric capacitance by forming air gaps between adjacent metal interconnects.

A yet still further object of the present invention is to form air gaps between adjacent metal interconnects using a self-sealing technique.

In accordance with the objects of this invention, a new method of forming metal interconnects with air gaps between adjacent interconnects in the manufacture of an integrated circuit device has been achieved. A semiconductor substrate comprising all layers and devices underlying planned metal interconnects is provided. The metal interconnects are formed overlying the semiconductor substrate. A silicon nitride liner layer is deposited overlying the metal interconnects. A gap filling oxide layer is deposited overlying the silicon nitride liner layer and filling gaps between adjacent metal interconnects. The gap filling oxide layer is polished down to the top surface of the silicon nitride liner layer. A silicon nitride thin layer is deposited overlying the gap filling oxide layer and the silicon nitride liner layer. The silicon nitride thin layer is patterned using a mask that is an oversized and reversed representation of the mask used to pattern the metal interconnects. The patterning of the silicon nitride thin layer creates openings to thereby expose a portion of the gap filling oxide layer between the adjacent metal interconnects. The gap filling oxide layer is etched away. A self-sealing oxide layer is deposited overlying the silicon nitride thin layer and the silicon nitride liner layer. The self-sealing oxide layer seals over the gaps between the silicon nitride thin layer and the silicon nitride liner layer to thereby form permanent air gaps between the adjacent metal interconnects, and the integrated circuit is completed.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of interconnects in the manufacture of an integrated circuit device. It should be clear to those experienced in the art that the present invention can be applied and extended without deviating from the scope of the present invention.

Figure 1:
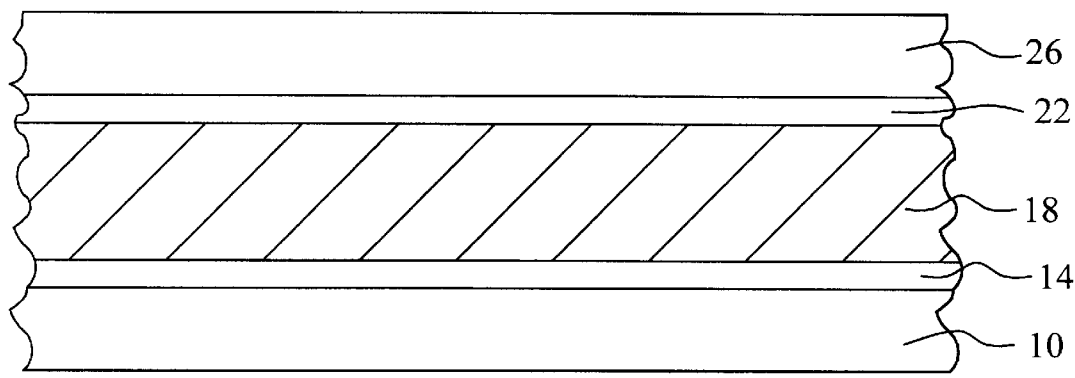
FIGS. 1 through 8 and 11 schematically illustrate in cross-section the preferred embodiment of the present invention.

Referring now particularly to FIG. 1, there is shown a cross section of a partially completed integrated circuit device of the preferred embodiment. A semiconductor substrate 10, typically consisting of monocrystalline silicon, is provided. It should be understood that the semiconductor substrate 10 may actually comprise several layers, including devices, isolations, and lower levels of interconnections. For purposes of simplification, the semiconductor substrate 10 is illustrated as a single layer.

A barrier layer 14 is deposited overlying the semiconductor substrate 10. The barrier layer 14 is the base layer for the planned metal interconnects. The barrier layer 14 serves as a barrier to metal ionic migration or diffusion. Depending on the composition of the barrier layer 14, it may also serve as an electrical isolation. The barrier layer 14 comprises titanium, titanium alloys, tantalum, and tantalum alloys. Examples of barrier layer 14 materials include Ti, Ti and TiN, Ti and TiW, and TaN. The barrier layer 14 is deposited to a thickness of between about 50 Angstroms and 800 Angstroms.

A metal layer 18 is deposited overlying the barrier layer 14. The metal layer 18 is the conductor for the planned interconnects. The metal layer comprises aluminum, aluminum alloys, copper, or copper alloys. The metal layer is preferably deposited to a thickness of between about 2,000 Angstroms and 20,000 Angstroms.

A capping layer 22 is deposited overlying the metal layer 18. The capping layer 22 forms a diffusion barrier to prevent out-diffusion of the metal layer 18. The capping layer 22 preferably comprises titanium and titanium alloys. For example, titanium nitride (TiN) may be used as the capping layer 22. The capping layer 22 is preferably deposited to a thickness of between about 100 Angstroms and 800 Angstroms.

A hard mask layer 26, comprising silicon nitride or silicon oxynitride, is deposited overlying the capping layer 22. The hard mask layer 26 will be used as a hard mask in the etching process used to define the metal interconnects. In this use, the hard mask layer 26 improves the etching capability when there is a lack of resist margin. In addition, the hard mask layer 26 will act as a polishing stop for good process control of the polishing step. The hard mask layer 26 is deposited by a conventional process to a thickness of between about 200 Angstroms and 1,000 Angstroms. Finally, an oxide layer may be used underlying the hard mask layer 26 to reduce stress.

The barrier layer 14, metal layer 18, capping layer 22, and the hard mask layer 26, comprise the metal stack of the planned metal interconnects. This combination of layers is illustrative of a preferred embodiment of the present invention. The composition of the metal stack could be altered by addition, subtraction, or substitution of layers without deviating from the intent of the invention.

Figure 2:
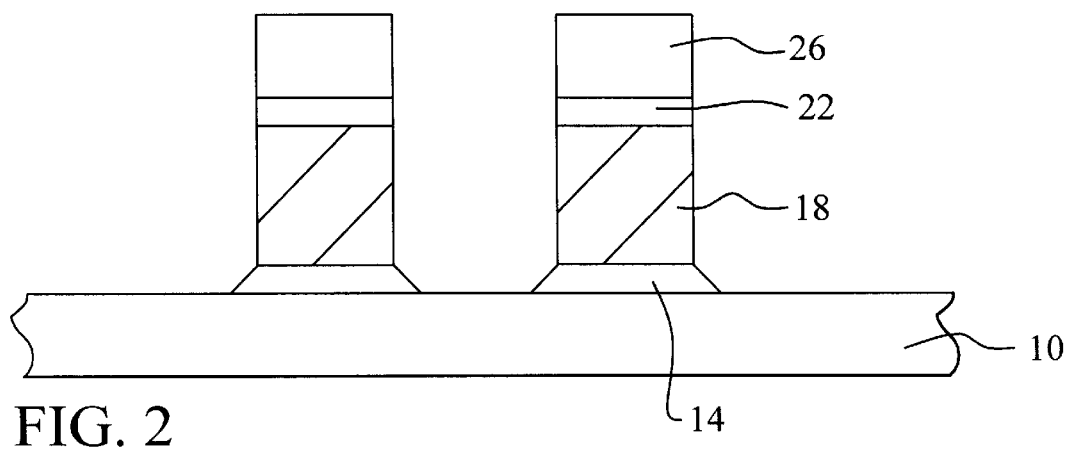

Referring now to FIG. 2, the metal stack is patterned to form the metal interconnects. A conventional photolithographic process may be used to perform the patterning. In this case, a photoresist layer, not shown, is deposited overlying the hard mask layer 26. The photoresist layer is exposed through the metal interconnect mask and then developed. The hard mask layer 26 is etched using the photoresist layer as a mask. The photoresist layer may then be removed. The capping layer 22, metal layer 18, and the barrier layer 14 are then etched through to complete the metal interconnects.

Figure 3:
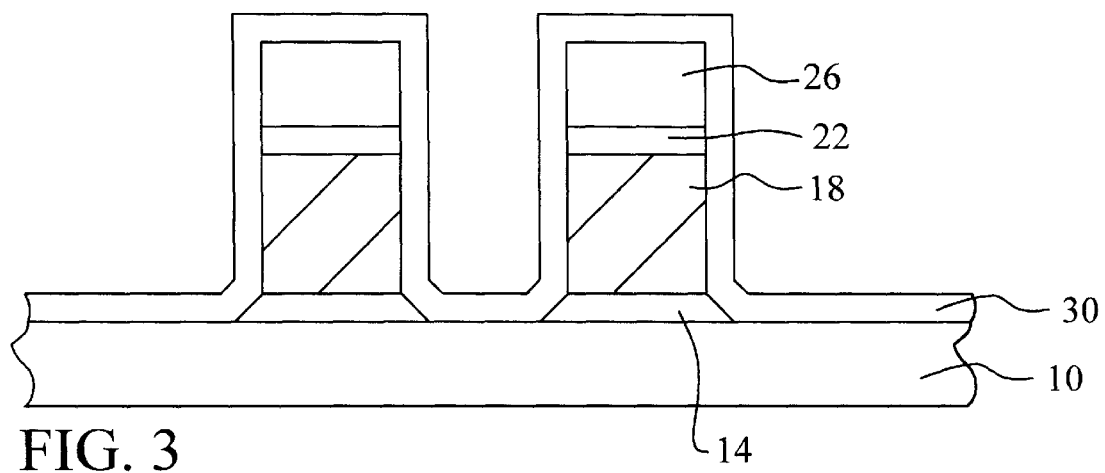

Referring now to FIG. 3, an important feature of the present invention is illustrated. A silicon nitride liner layer 30 is deposited overlying the metal interconnects. The silicon nitride liner layer 30 will serve two functions in the present invention. First, it will act as a polishing stop for the polishing down of the subsequently deposited gap filling oxide layer. Second, it will serve as a metal barrier during the removal of the gap filling oxide layer. The silicon nitride liner layer 30 is preferably deposited using a conventional chemical vapor deposition (CVD) process. The silicon nitride liner layer 30 is deposited to a thickness of between about 250 Angstroms and 800 Angstroms.

Figure 4:
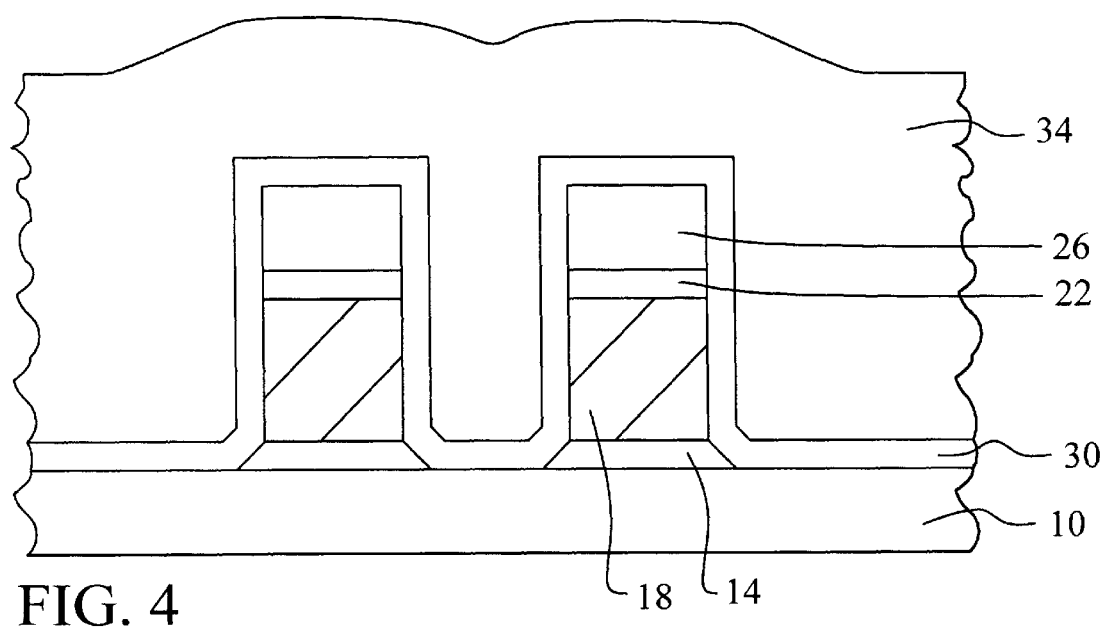

Referring now to FIG. 4, a gap filling oxide layer 34 is deposited overlying the silicon nitride liner layer 30. The gap filling oxide layer 34 will temporarily fill all of the spaces between adjacent metal interconnects. When the gap filling oxide layer 34 is later removed, air gaps will be left that can be easily sealed over. The gap filling oxide layer 34 preferably comprises a doped silicon dioxide material such as phosphosilicate glass (PSG), borophosphosilicate glass (BPSG), fluorine-doped silicate glass (FSG), and fluorinated silicate glass (FSG). Doped silicon dioxide is used for the gap filling oxide layer 34 because this material may be formed by chemical vapor deposition (CVD) and then reflowed to achieve excellent gap fill at lower temperatures than an undoped oxide. In the preferred embodiment, the gap fill oxide layer 34 is deposited to a thickness of between about 3,000 Angstroms and 25,000 Angstroms.

Figure 5:
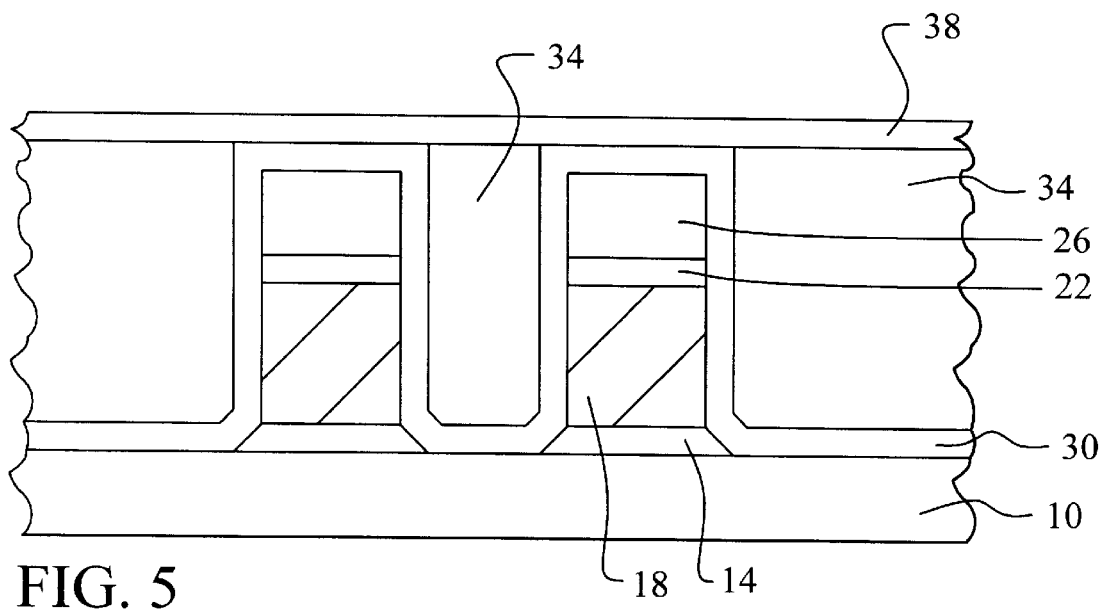

Referring now to FIG. 5, the gap filling oxide layer 34 is polished down to the top surface of the silicon nitride liner layer 30. The polishing down operation removes unneeded oxide and confines the gap filling oxide layer 34 to only the spaces between the metal interconnects. The silicon nitride liner layer 30 stops the polishing down once the overlying gap filling oxide layer 34 is removed. The polishing down is performed using a conventional chemical mechanical polishing (CMP) process that is selective to oxide while having a much lower etch rate for silicon nitride.

Another important feature of the present invention is the deposition of a silicon nitride thin layer 38 overlying the gap filling oxide layer 34 and the silicon nitride liner layer 30. The silicon nitride thin layer 38 will form the main structure overlying the gaps between the metal interconnects. In the subsequent processing, once the gap filling oxide layer 34 is removed, the silicon nitride thin layer 38 can be sealed to form permanent air gaps. The silicon nitride thin layer 38 is deposited using a conventional CVD process to a thickness of between about 100 Angstroms and 500 Angstroms.

Figure 6:
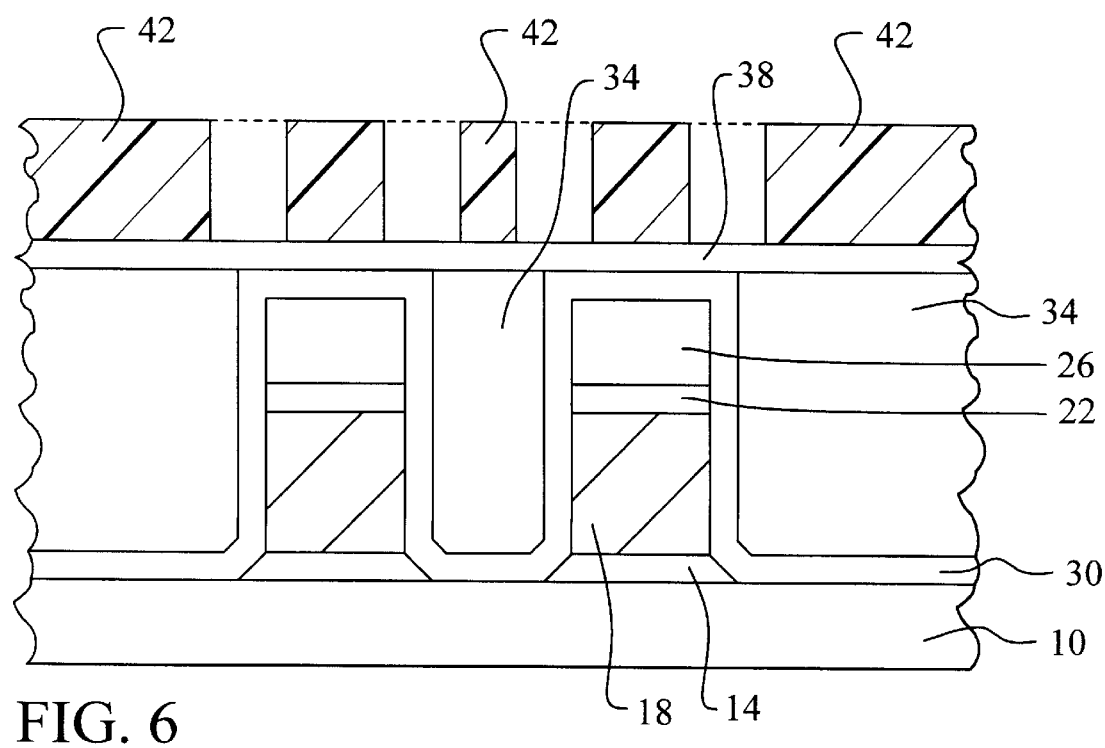

Referring now to FIG. 6, another important part of the present invention is shown. The silicon nitride thin layer 38 is patterned using a randomly-oversized reverse mask of the metal interconnect pattern. The randomly-oversized reverse mask pattern is created by an algorithm such that isolated metal lines (those spaced greater than 1.5 microns) are covered and such that the nitride openings are joined at equal intervals. In this way, sufficient rectangular openings may be etched in the silicon nitride thin layer 38 to allow for subsequent removal of the underlying gap filling oxide layer 34. In addition, the etched silicon nitride thin layer 38 will have a sufficient structural grid supported by the underlying metal lines. As an alternative, random circular openings may be formed in the silicon nitride thin layer 38 between the metal lines.

In the preferred embodiment, a photoresist layer 42 is deposited overlying the silicon nitride thin layer 38. The photoresist layer 42 is exposed through a mask. The mask data is an oversized and reversed polarity representation of the mask data used to define the metal interconnects. By using an oversized and reversed mask of the metal interconnects, the photoresist layer 42 that remains after developing will cover the central portions of the gaps between the metal interconnects. However, due to misalignment, there will be gaps where the subsequently etched silicon nitride thin layer 38 will no longer cover the gap filling oxide layer 34.

Figure 7:
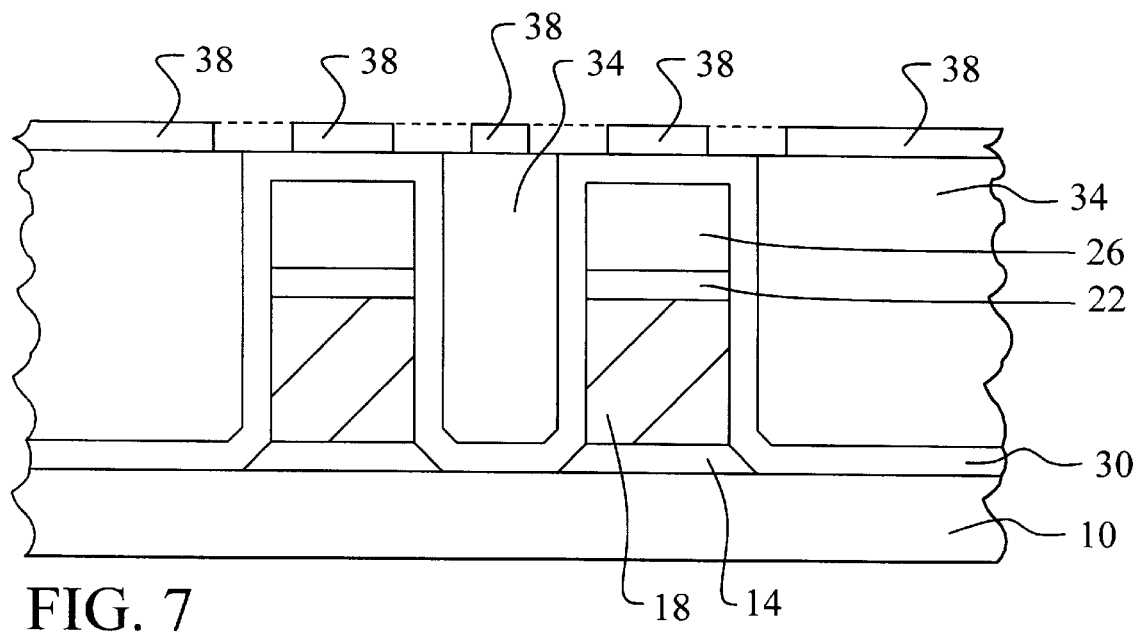

Referring now to FIG. 7, the silicon nitride thin layer 38 is etched through to the top surface of the gap filling oxide layer 34. Because of the oversized and reversed mask, the etching step leaves gaps between the silicon nitride thin layer 38 and the silicon nitride liner layer 30 and thereby exposes a part of the gap filling oxide layer 34 in each gap area.

Figure 8:
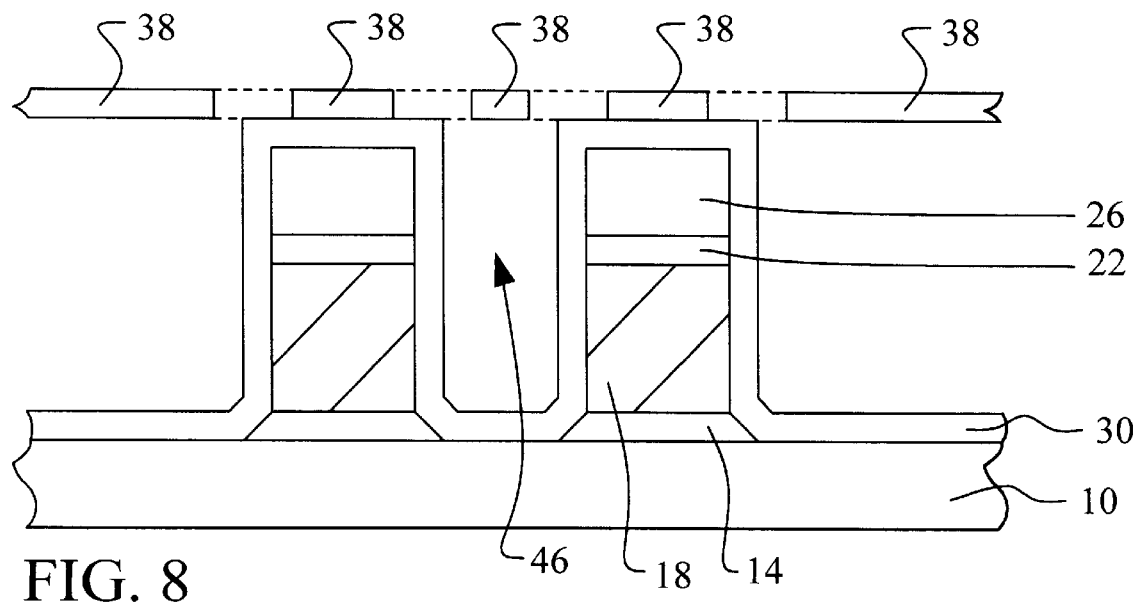

Referring now to FIG. 8, the gap filling oxide layer 34 is etched away using an anhydrous hydrofluoric acid (HF) solution. By removing the gap filling oxide layer 34, the silicon nitride thin layer 38 is left overlying the gaps. In addition, the gaps between the metal interconnects have only air as the dielectric barrier 46. The wet etchant can penetrate the gaps between the silicon nitride thin layer 38 and the silicon nitride liner layer 30 to etch the oxide material.

Figure 9:
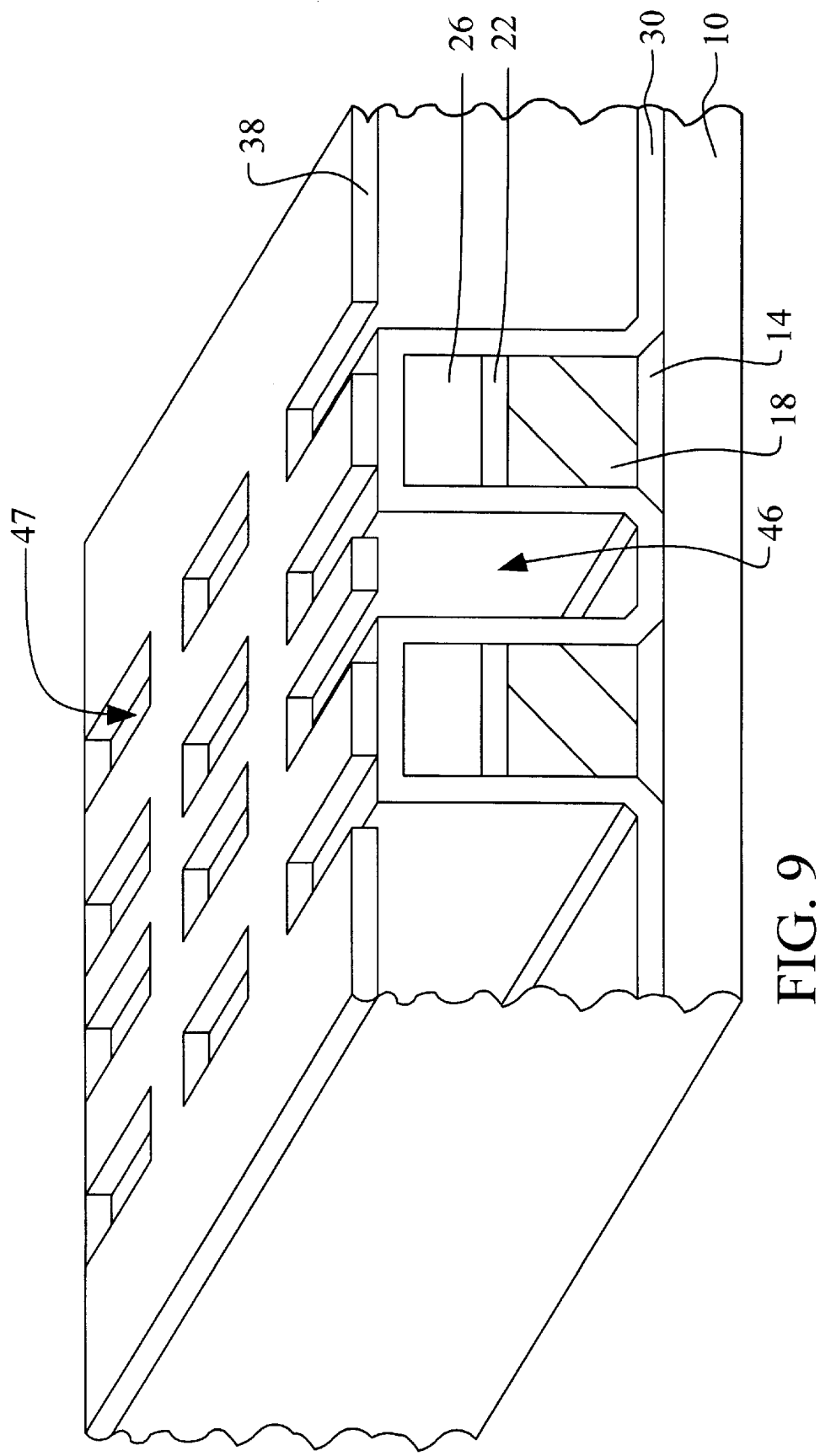
FIGS. 9 and 10 schematically illustrate in isometric views the partially-completed integrated circuit device.

Referring now to FIG. 9, an isometric view of the partially-completed integrated circuit device is shown. Note that the silicon nitride thin layer 38, which appeared to be floating in space in FIG. 8, is actually supported by the connected grid of the silicon nitride thin layer 38. The randomly-oversized, reversed mask pattern discussed in connection with FIG. 6, is illustrated in FIG. 9 as equally spaced rectangular openings 47 formed in the silicon nitride thin layer 38. The openings 47 allow the etching solution to penetrate and remove the gap filling oxide layer 34 from between the metal lines. The air gaps 46 are thereby formed. At the same time, the silicon nitride thin layer 38 is structurally supported by the metal lines.

Figure 10:
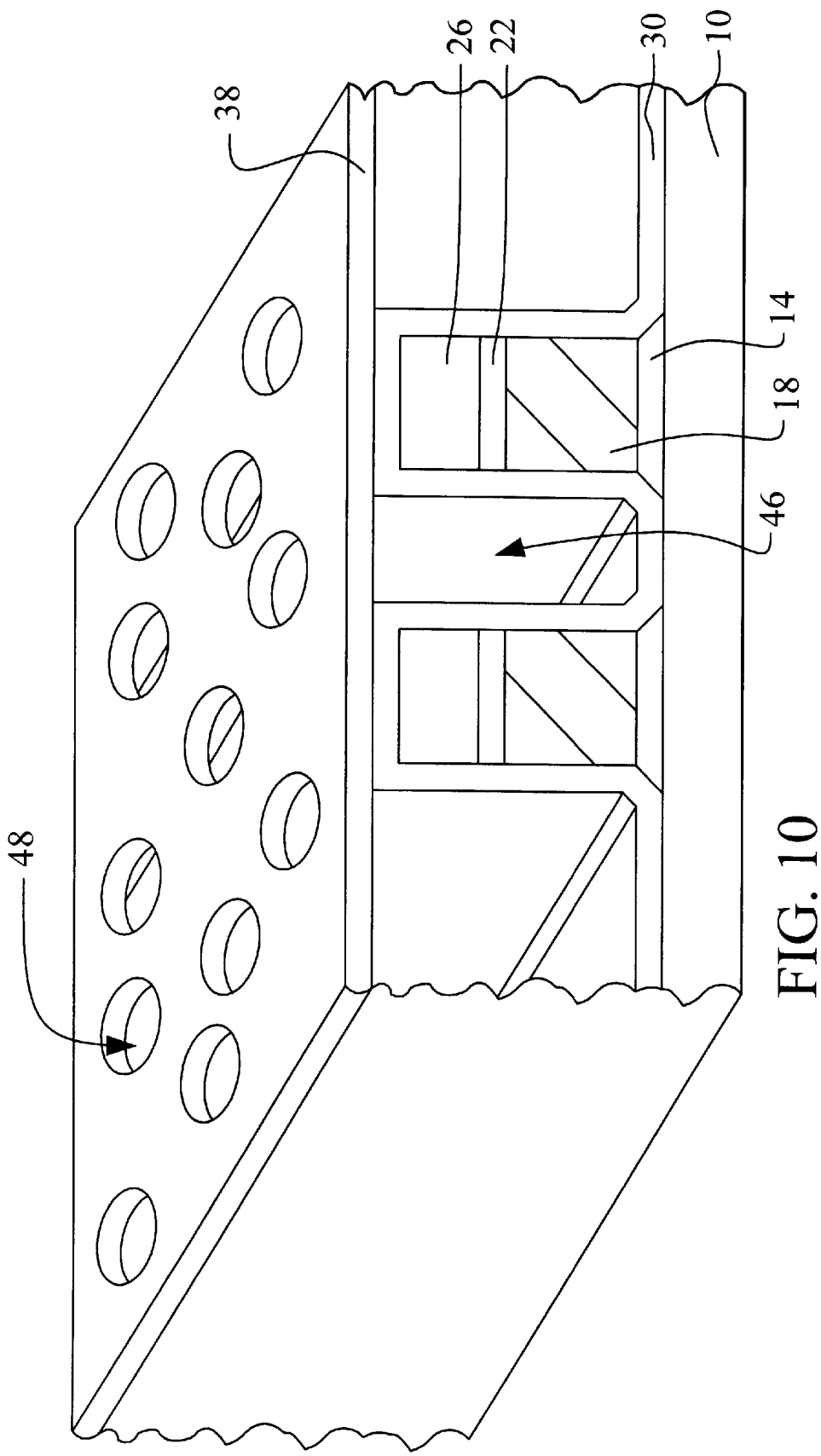

Referring now to FIG. 10, an alternative opening pattern is shown in isometric view. Instead of the randomly-oversized rectangular openings, the algorithm is changed to produce random circular openings 48 in the silicon nitride thin layer 38 between the metal lines. Once again, the openings 48 allow the gap filling oxide layer 34 to be removed. The silicon nitride thin layer 38 is structurally supported by the metal lines.

Figure 11:
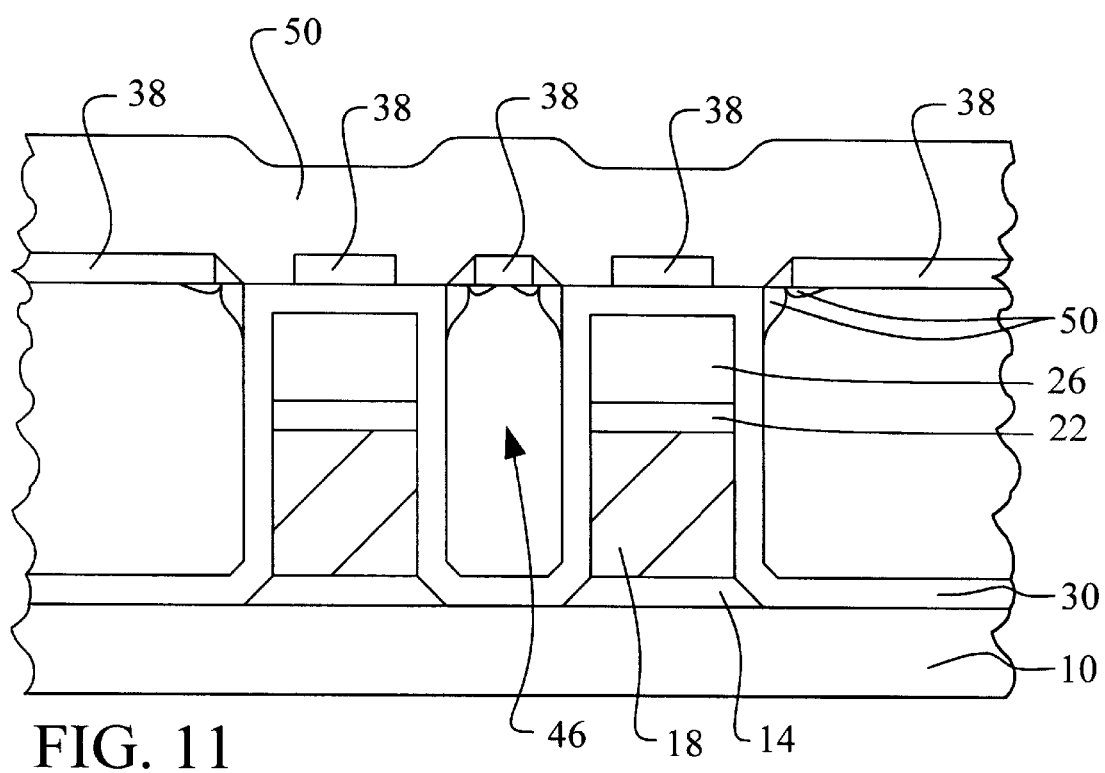

Referring now to FIG. 11, a self-sealing oxide layer 50 is deposited overlying the silicon nitride thin layer 38 and the silicon nitride liner layer 30. The self-sealing oxide layer penetrates, but only partially, the small gaps between the silicon nitride thin layer 38 and the silicon nitride liner layer 30. Therefore, the deposition of the self-sealing oxide layer 50 causes the formation of permanent air gaps 46 between the metal interconnects in the manufacture of the integrated circuit device. The self-sealing oxide layer 50 preferably comprises silicon dioxide deposited in a CVD process by the dissociation of tetraethoxysilane (TEOS). This is also called a TEOS oxide.

The specific advantage of the present invention is the formation of air gap dielectrics between adjacent metal interconnects in the integrated circuit device. The process provides this advantage using a single masking step and established processes. The inclusion of thus formed air gap dielectrics improves circuit performance.

As shown in the preferred embodiments, the present invention provides a very manufacturable process for forming air gap dielectrics between metal interconnects in an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to form air gaps between metal interconnects in the manufacture of an integrated circuit device comprising:

providing metal interconnects overlying a semiconductor substrate;

depositing a silicon nitride liner layer overlying said metal interconnects and said semiconductor substrate;

depositing a gap filling oxide layer overlying said silicon nitride liner layer to fill gaps between adjacent said metal interconnects;

polishing down said gap filling oxide layer stopping when the top surface of said silicon nitride liner layer is exposed;

depositing a silicon nitride thin layer overlying said silicon nitride liner layer and said gap filling oxide layer;

patterning said silicon nitride thin layer to create openings to thereby expose parts of said gap filling oxide layer;

etching away said gap filling oxide layer; and depositing a self-sealing oxide layer overlying said silicon nitride liner layer and said silicon nitride thin layer to thereby form permanent air gaps between adjacent said metal interconnects to complete said integrated circuit device.

2. The method according to claim 1 wherein said gap filling oxide layer comprises doped silicon dioxide.

3. The method according to claim 1 wherein said silicon nitride thin layer is deposited to a thickness of between about 100 Angstroms and 500 Angstroms.

4. The method according to claim 1 wherein said step of patterning said silicon nitride thin layer uses a mask comprising data that is an oversized and reversed representation of the mask data used to pattern said metal interconnects.

5. The method according to claim 1 wherein said step of patterning said silicon nitride layer forms random circular openings between said metal interconnects.

6. The method according to claim 1 wherein said step of etching away said gap filling oxide layer is by a wet etching process comprising anhydrous hydrofluoric acid.

7. The method according to claim 1 wherein said self-sealing oxide layer comprises silicon dioxide deposited in a chemical vapor deposition process based on the dissociation of tetraethoxysilane (TEOS).

8. A method to form air gaps between metal interconnects in the manufacture of an integrated circuit device comprising:

providing metal interconnects overlying a semiconductor substrate;

depositing a silicon nitride liner layer overlying said metal interconnects and said semiconductor substrate;

depositing a gap filling oxide layer overlying said silicon nitride liner layer to fill gaps between adjacent said metal interconnects;

polishing down said gap filling oxide layer stopping when the top surface of said silicon nitride liner layer is exposed;

depositing a silicon nitride thin layer overlying said silicon nitride liner layer and said gap filling oxide layer;

patterning said silicon nitride thin layer to create openings to thereby expose parts of said gap filling oxide layer wherein said patterning said silicon nitride thin layer uses a mask comprising data that is an oversized and reversed representation of the mask data used to pattern said metal interconnects;

etching away said gap filling oxide layer; and depositing a self-sealing oxide layer overlying said silicon nitride liner layer and said silicon nitride thin layer to thereby form permanent air gaps between adjacent said metal interconnects to complete said integrated circuit device.

9. The method according to claim 8 wherein said gap filling oxide layer comprises doped silicon dioxide.

10. The method according to claim 8 wherein said silicon nitride thin layer is deposited to a thickness of between about 100 Angstroms and 500 Angstroms.

11. The method according to claim 8 wherein said step of etching away said gap filling oxide layer is by a wet etching process comprising anhydrous hydrofluoric acid.

12. The method according to claim 8 wherein said self-sealing oxide layer comprises silicon dioxide deposited in a chemical vapor deposition process based on the dissociation of tetraethoxysilane (TEOS).

13. A method to form metal interconnects with air gaps therebetween in the manufacture of an integrated circuit device comprising:

providing a semiconductor substrate wherein said semiconductor substrate comprises layers, devices, isolations, and lower interconnect levels;

depositing a barrier layer overlying said semiconductor substrate;

depositing a metal layer overlying said barrier layer;

depositing a capping layer overlying said metal layer;

depositing a hard mask layer overlying said capping layer;

patterning said hard mask layer to form a hard mask where said metal interconnects are planned;

etching through said capping layer, said metal layer, and said barrier layer to complete said metal interconnects;

depositing a silicon nitride liner layer overlying said metal interconnects and said semiconductor substrate;

depositing a gap filling oxide layer overlying said silicon nitride liner layer to fill gaps between adjacent said metal interconnects;

polishing down said gap filling oxide layer stopping when the top surface of said silicon nitride liner layer is exposed;

depositing a silicon nitride thin layer overlying said silicon nitride liner layer and said gap filling oxide layer;

patterning said silicon nitride thin layer to create openings to thereby expose parts of said gap filling oxide layer wherein said patterning said silicon nitride thin layer uses a mask comprising data that is an oversized and reversed representation of the mask data used to pattern said metal interconnects;

etching away said gap filling oxide layer; and depositing a self-sealing oxide layer overlying said silicon nitride liner layer and said silicon nitride thin layer to thereby form permanent air gaps between adjacent said metal interconnects to complete said integrated circuit device.

14. The method according to claim 13 wherein said barrier layer comprises one of the group of: titanium, titanium alloys, tantalum, and tantalum alloys.

15. The method according to claim 13 wherein said metal layer comprises one of the group of: aluminum, aluminum alloys, copper, and copper alloys.

16. The method according to claim 13 wherein said capping layer comprises titanium nitride.

17. The method according to claim 13 wherein said gap filling oxide layer comprises doped silicon dioxide.

18. The method according to claim 13 wherein said silicon nitride thin layer is deposited to a thickness of between about 100 Angstroms and 500 Angstroms.

19. The method according to claim 13 wherein said step of etching away said gap filling oxide layer is by a wet etching process comprising anhydrous hydrofluoric acid.

20. The method according to claim 13 wherein said self-sealing oxide layer comprises silicon dioxide deposited in a chemical vapor deposition process based on the dissociation of tetraethoxysilane (TEOS).

* * * * *